United States Patent [19]

Boeckl

[11] 4,068,019
[45] Jan. 10, 1978

[54] SPIN COATING PROCESS FOR PREVENTION OF EDGE BUILDUP

[75] Inventor: Richard Stefan Boeckl, San Jose, Calif.

[73] Assignee: International Business Machines Corporation, Armonk, N.Y.

[21] Appl. No.: 739,756

[22] Filed: Nov. 8, 1976

[51] Int. Cl.² .......................... B05D 5/12; B05C 13/02
[52] U.S. Cl. .......................................... 427/82; 118/52; 118/506; 427/240
[58] Field of Search ...................... 118/52, 506, 56, 54, 118/500; 427/240, 241, 82; 297/1 C

[56] References Cited

U.S. PATENT DOCUMENTS 3,323,491   6/1967   Granick ............................ 118/506

FOREIGN PATENT DOCUMENTS

A54,387   9/1949   France ................................ 118/52

OTHER PUBLICATIONS

IBM Technical Disclosure Bulletin, Evaporation Water Carrier, T.A. Gunter et al., vol. 14, No. 12, May 1972, pp.3693-3694.
IBM Technical Disclosure Bulletin, Spin Coating Photoresist, P.W. Reed et al., vol. 16, No. 5, Oct. 1973, pp. 1535-1536.
IBM Technical Disclosure Bulletin, Controlled Gap Photoresist Spinning Process, J.E. Holihan, Sr. and L.Landstein, vol. 17, No. 11, Apr. 1975, p. 3281.

*Primary Examiner*—James Kee Chi
*Attorney, Agent, or Firm*—James A. Pershon

[57] ABSTRACT

A spin coating process produces a constant film thickness across a planar substrate by placing a frame around the substrate boundary to act as an auxiliary surface to allow a continuous film of the fluid to be spin coated. The auxiliary surface is elevated with respect to the plane of the substrate surface.

8 Claims, 4 Drawing Figures

SPIN COATING PROCESS FOR PREVENTION OF EDGE BUILDUP

BACKGROUND OF THE INVENTION

This invention relates generally to a coating process and more specifically to a coating process utilizing centrifugal force with a framed substrate to prevent edge buildup of the material.

FIELD OF THE INVENTION

The use of spin or centrifuge coating apparatus to place a thin layer of material on a substrate is well-known. For instance, wafers forming semiconductor substrates are coated with a photoresist material that is spin coated as an electrical insulator and for area masking. The apparatus and processes formerly used to produce uniform thin films by the spin coating process were sufficient for the requirements of that time. A problem existed using the spin coating process in that the coating material forms a thicker layer at the edges of the substrate from that produced across the remaining area. This thicker layer or edge buildup caused the photoresist development masks, for instance, to be spaced from the majority of the area of the substrate thereby causing alignment errors in the subsequent deposited materials.

Further, ultra thin and ultra flat coatings are the requirements of the thin films for today's applications. The spin coating of resist layers results in an untolerable edge buildup of more than five microns. The edge buildup can become an order of magnitude thicker than the spin coated film layer itself. Different apparatus including multiple spinning operations are commonly used in an attempt to prevent an edge buildup of the material at each edge of the wafer substrate.

It is, therefore, an object of the present invention to provide a process together with an apparatus that will minimize the edge buildup of the material at the edges of the substrate.

DESCRIPTION OF THE PRIOR ART

In the prior art an attempt to obtain a flat surface coating is performed by controlling the evaporation rate of the coating solvent during the spinning process as disclosed in the IBM Technical Disclosure Bulletin entitled "Controlled Gap Photoresist Spinning Process," Vol. 17, No. 11, April 1975 at page 3281. The use of a highly charged ionizing gas in a dry inert atmosphere to highly charge the wafer surface for avoiding variations and coating thicknesses is disclosed in the IBM Technical Disclosure Bulletin, entitled "Photoresist Application Process," Vol. 14, No. 2, July 1971 at page 595. A further article that controls the rate of resist evaporation during spinning in order to obtain a uniform thickness for the resulting film is disclosed in the IBM Technical Disclosure Bulletin, entitled "Rheology Control of Films Deposited by Spin Coating Techniques," Vol. 16, No. 6, November 1973 at page 1730.

Concentric spinning apparatus where the object being coated about its rotational center point while itself is being rotated around a second rotational center point is disclosed in an article entitled "Method for Producing Uniform Control Thin Films," in the IBM Technical Disclosure Bulletin, Vol. 3, No. 1, June 1960 at page 5. A different apparatus with a somewhat similar control is disclosed in the article "Spin Coating Photoresist," published in the IBM Technical Disclosure Bulletin, Vol. 16, No. 5, October 1973 at page 1535. It is also known that the thickness of spin coated material depends upon different parameters as disclosed in the IBM Technical Disclosure Bulletin, entitled "Resist Thickness Regulation," Vol. 17, No. 4, September 1974, page 1048–9.

The problems of the edge buildup of a material are discussed in the article entitled "Remover for Peripheral Resist Buildups," published in the IBM Technical Disclosure Bulletin at Vol. 19, No. 6, November 1976. This article discloses the use of a jet of gas to blow off the concentration of the resist at the edges of the substrate. Extremely close control of the viscosity of the coating, the distance between the gas jet and the substrate, and the velocity of the gas are required to prevent removal of the thin coating required.

Another object of this invention, therefore, is to provide a process together with the framing apparatus that permits closely controlled spin coated films without undue control requirements on the spin coating process and apparatus used.

SUMMARY OF THE INVENTION

In accordance with the present invention, a process for prevention of material buildup at the edge of substrates comprises attaching a frame boundary having an elevated surface around the substrate, applying a coating material to the substrate, and spinning the substrate to apply a centrifugal force to the coating material to apply a thin film across the substrate.

The apparatus for applying a film of material by spin coating comprises a means for rotating the substrate about its approximate center location, means for applying the coating material to the substrate, and means for forming a frame boundary attached around the periphery of the substrate with the frame having an elevated surface above the planar surface of the substrate.

An object of the present invention, therefore, is to provide an enhanced process and apparatus for forming a thin film of material on a substrate.

Another object of this invention is to provide a process and apparatus usable in spin coating a thin film material on a substrate.

Yet another object is to provide a process and apparatus wherein a frame boundary is attached around a substrate having an elevated boundary to the planar surface of the substrate wherein the edge buildup of the material as a result of the spin coating is minimized.

These and other objects of the present invention will become apparent to those skilled in the art as the description proceeds.

BRIEF DESCRIPTION OF THE DRAWING

The various novel features of this invention, along with the foregoing and other objects, as well as the invention itself both as to its organization and method of operation, may be fully understood from the following description of illustrated embodiments when read in conjunction with the accompanying drawing, wherein.

DESCRIPTION OF THE PREFERRED EMBODIMENT

Figure 1:
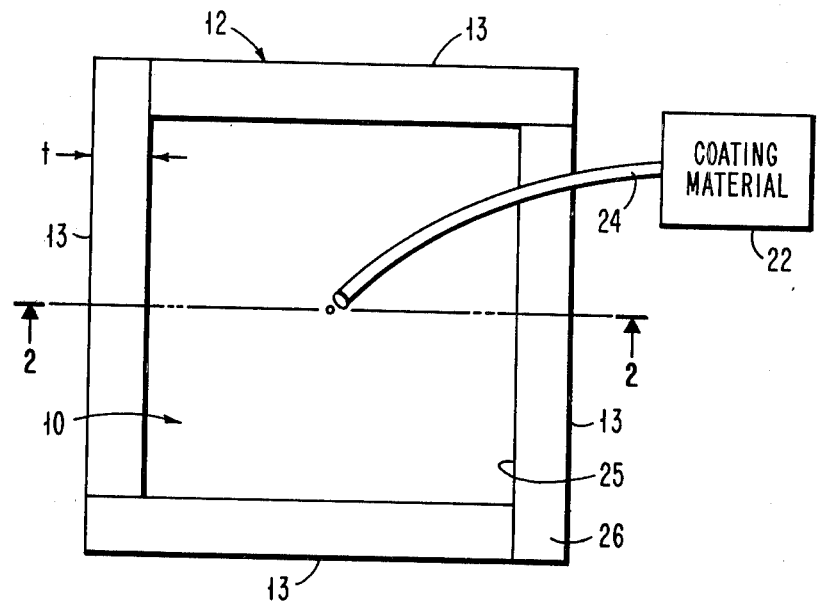
FIG. 1 is a top view of a substrate including an elevated frame boundary according to the present invention.
Figure 2:
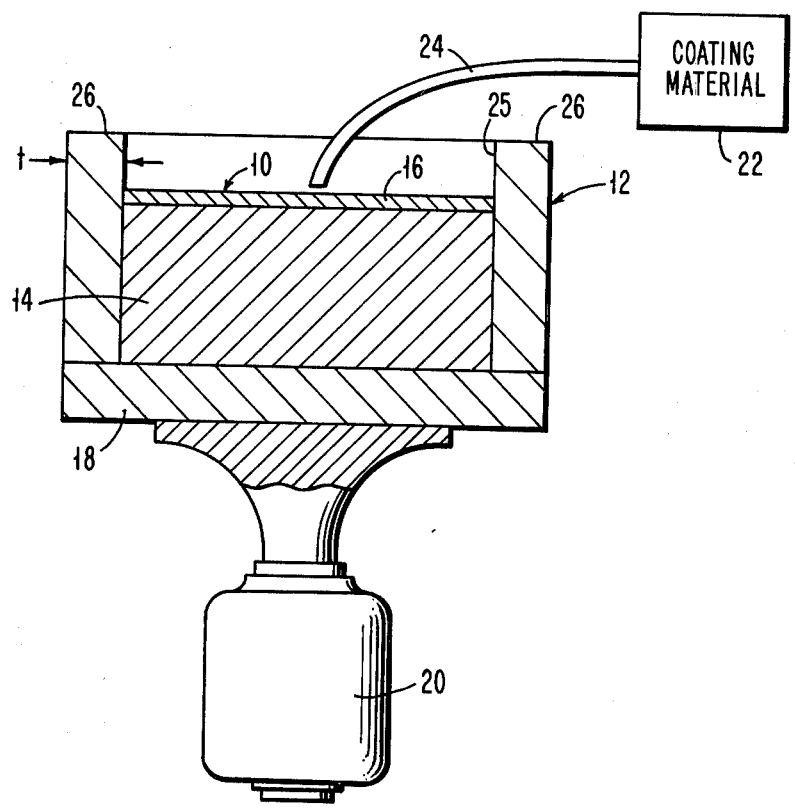
FIG. 2 is a simplified schematic sectional view taken along lines 2—2 of FIG. 1 of a typical spin coating apparatus including the frame boundary around the substrate according to the present invention.

In FIG. 1 a wafer 10 in the shape of a square is supported around its periphery by a frame 12. The wafer 10 is supported at a distance below the top most portion of the frame 12, see FIG. 2. In FIG. 2, the wafer 10 comprises a substrate 14 and a film layer 16 of the coating material. The frame 12 includes side walls 13 having a thickness $t$. The side walls should be rigid enough to support the substrate 14 during a spinning operation. Or the substrate 14 can be supported by a vacuum chuck (not shown) with the frame 12 being more fully supported by the substrate 14. The thickness $t$ of the frame is not important, although the frame must have some breadth. A one millimeter thickness appears to be a minimum thickness. Inside walls 25 and top auxiliary surface 26 of the frame 12 should be smooth to allow an easy flow of the coating material over the frame during a spin coating operation.

The frame 12 is supported on a pedestal 18 for rotation by a rotating means shown as an electrical motor 20. The coating material is dispensed from a storage receptable 22 via a transportation tube 24 onto the approximate center of the substrate 14 for forming the film layer 16 during a spin coating process. The receptable 22 together with the transporting tube 24 form the dispensing means for the coating material during the spin coating process.

The heart of the present invention is the location of the wafer 10 and uncoated substrate 14 beneath the top most portion, auxiliary surface 26, of the frame 12. This height difference which is the distance between the top planar surface of the substrate 14 and the auxiliary surface 26 of the frame 12 is identified as the frame elevation in the figures. This difference in the elevation levels provides the key to the minimization of the edge buildup of the coating material during the spin coating process. This effect is best shown by referring to the graph of FIG. 3.

Figure 3:
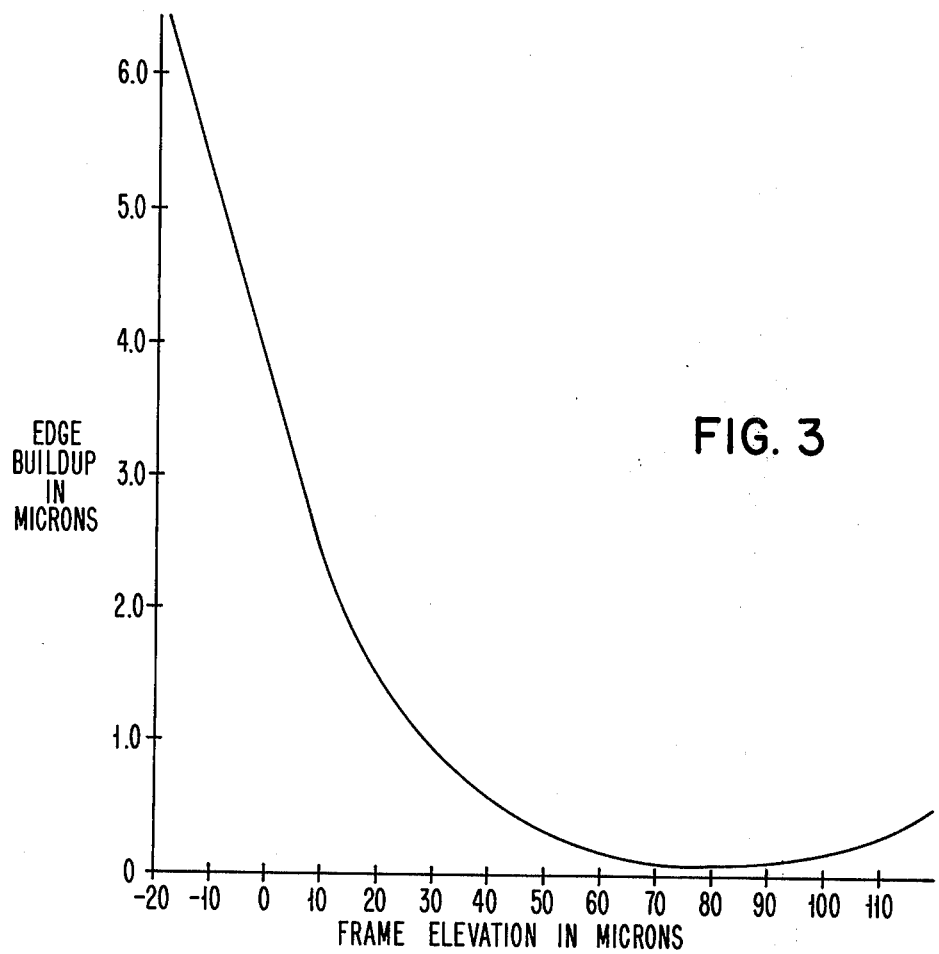
FIG. 3 illustrates a graph showing the dependency of the edge buildup of the coating material on the difference in the height between an auxiliary and the substrate surface.

In FIG. 3, the edge buildup resulting from the spin coating process as measured in microns is computed to the frame elevation, that is, the difference between the top planar surface of the substrate and the upper most portion of the frame, also measured in microns. The frame elevation is gauged from 20 microns below the planar surface of the substrate to 110 microns above the same planar surface. This graph was drawn as a result of different frame elevations while dispensing a coating material onto a glass substrate. The coating material is a proprietary photoresist manufactured by the Shipley Company, under the trade name AZ-1300 Series Positive Photo Resists, specifically AZ-1350J. The parameters of the coating material such as kinematic viscosity determines the film thickness and can have an effect upon the thickness of the edge buildup of material formed at the edges of the substrate if the frame of the present invention is not used. The AZ 1350J photoresist has a viscosity of approximatey 30.5 centistokes.

The spin coating of substrates with photoresist and other fluids is a widely known and frequently used method to produce film coatings of 0.1 to 5.0 microns thickness. Applications range from photoresist coatings on semiconductor wafers to ferric oxide coatings used for disk file substrates. If a planar substrate having an average symmetrical dimension is spin coated at an angular velocity, a film is obtained having a uniform thickness up to but excluding the edges of the substrate. The film thickness is dependent only upon the symmetrical dimension, the angular velocity of the spin coating process, and the kinematic viscosity of the liquid coating material. A considerable increase in film thickness occurs at the edges of the substrates as a result of the spin coating process. The difference in coating thickness between the edge and the center of the substrate is referred to as the edge buildup. The edge buildup is the result of equilibrium between surface energy and rotational energy. At equilibrium, the surface energy per unit length of substrate edge equals the rotational energy and therefore no new liquid to air surfaces can be formed, that is, at this point no more liquid is spun off as a result of the centrifugal forces during the spin coating process. For 38 millimeter square substrates spin coated at 1500 rpm with the Shipley photoresist mentioned above, the edge buildup produced the graph shown in FIG. 3. The film thickness profiles were taken with a stylus instrument using common techniques for measuring the thickness of thin film layers.

As shown in FIG. 3, an increase in the frame elevation from below the planar surface of the substrate to approximately 60 microns above the substrate produced a substantial decrease in the edge buildup of the coating material. An edge buildup of 7 microns resulted when the auxiliary surface of the frame was located 20 microns below the planar surface of the substrate. The edge buildup decreased to well beneath one micron when the frame elevation was 30 microns, that is, when the auxiliary surface was located at a distance of 30 microns above the substrate surface. The edge buildup can be reduced to 0.2 microns ±0.1 microns by the use of a frame elevated approximately 50 microns above the surface of the substrate, from the approximate 7 microns of edge buildup at a regular edge without using a frame. The edge buildup has a strong dependence on the difference in height between the auxiliary surface of the frame and the substrate surface. The simple frame fixture shown in FIGS. 1 and 2 around the boundaries of the substrate minimizes an edge buildup provided the plane of the frame is elevated from approximately 40 to 100 microns over the plane of the substrate. Gaps between the frame fixture and the substrate must be kept smaller than approximately 20 microns.

Figure 4:
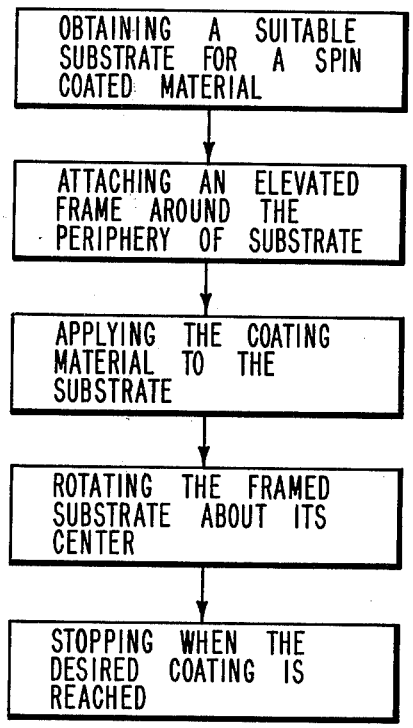
FIG. 4 is a block diagram of the process steps for forming a thin film of material using a spin coating process according to the present invention.

The process for obtaining a substrate having a spin coated thin film layer that has a minimized edge buildup according to the present invention is shown in FIG. 4. The process steps will be explained using the apparatus disclosed in FIGS. 1 and 2.

Referring to FIG. 4, the process starts by obtaining a suitable substrate such as substrate 14 for placing a spin coated thin film layer of material thereon. A suitable substrate could be a non-conductive wafer usable for a semiconductor element such as a ceramic, or a magnetic substrate such as a ferrite, or a suitable substrate for a magnetic spin coated layer such as glass or aluminum. The substrates must be suitably prepared for the spin coating process such as cleaned and lapped in a manner necessary for adhesion and smoothness of the spin coated film. Preliminary coats may be deposited prior to the spin coated thin film layer 16.

The substrate 14 is then placed into a frame such as frame 12 of FIGS. 1 and 2 that has an elevated auxiliary surface 26. The frame is attached around the entire periphery of the substrate with the elevated auxiliary surface a distance above the planar surface of the substrate according to the edge buildup minimization required. Thus for the square shaped substrate 14 of FIG. 1, a frame 12 comprising four equal lengths are located around the periphery of the substrate.

The coating material is then applied to the substrate 14 as shown in FIG. 2 according to the next step of FIG. 4. The coating material is generally applied at the approximate center or as close thereto as permitted by the shape of the substrate to permit the centrifugal force of the rotating substrate to distribute the coating material across the planar surface of the substrate. The next step in the process shown in FIG. 4 is the step of rotating the framed substrate about its approximate center. In FIGS. 1 and 2, the rotation can be produced by the electric motor 20 which rotates the pedestal 18 supporting the framed substrate 14. The rotational velocity imparted to the substrate is a function of the coating material thickness desired and the viscosity of the coated material as previously discussed. The process ends when the desired coating distribution is reached. The time required to obtain the coated substrate with the parameters required is generally determined experimentally. The spinning is stopped after the time period is reached.

The centrifugal forces applied to the coating material as a result of the spinning of the substrate causes the coating material to form across the surface of the substrate. Any buildup of the material at the edges of substrate is impelled up and over the auxiliary surface of the elevated frame. There is little or no edge buildup around the periphery of a substrate if the substrate is framed as taught in the present invention. The buildup of the coating material at the edges is avoided and the substrate with the thin film layer is directly usable for masking and development of the photoresist for example, for further processing of the substrate. The further usage of the prepared substrate such as for a semiconductor production is well known and need not be further discussed here. The mask can be applied directly to the photoresist coating material as discussed herein without further processing of the wafer. The edge buildup is minimized such that the series of steps normally involved to expose the edges and to develop the photoresist only at the edges together with the process then of cleaning the edges of the substrate are no longer necessary. These procedures serve no functional purpose and thus merely added to the cost and extra handling formerly required.

The principles of the present invention have now been made clear and an illustrated embodiment. There will be immediately obvious to one skilled in the art many modifications of structure, arrangement, proportions, the elements, materials and components used in the practice of the invention. For instance, the substrates and the frame may be any shape such as circular or rectangular and need not be square as shown in the illustrative embodiment of FIGS. 1 and 2. The only requirement is that a snug fit be provided between the substrate and the elevated frame. Gaps between the framed fixture and the substrate must be kept at a minimum or the gap will appear as an unprotected edge to the coating material and edge buildup will form at that gap. Further, it is obvious that any coating material could be used. The only requirement is that the material be capable of being spin coated to form a film layer of material on a substrate. The appended claims are, therefore, intended to cover and embrace any such modification, within the limits only of the true spirit and scope of the invention.

I claim:

1. In a spin coating process, the steps for minimizing the edge buildup of a coating material to be coated onto a substrate comprising:

attaching a frame boundary immediate to the periphery of the substrate with a surface of the he frame boundary elevated above the planar surface of the substrate that is to be coated;

depositing the coating material onto the framed substrate; and rotating the framed substrate in a horizontal upright position with the deposited material about its approximate center, said frame boundary elevated surface becoming an auxiliary surface extension to the substrate for the deposited coating material during the step of rotating the framed substrate.

2. A spin coating process as defined in claim 1 wherein the step of rotating the framed substrate is performed prior to the step of depositing the coating material.

3. A spin coating process as defined in claim 1 wherein the step of depositing the coating material deposits a liquid photoresist material.

4. A spin coating process as defined in claim 1 further including the step of stopping the rotating framed substrate when the desired coating is reached.

5. A spin coating process as defined in claim 1 wherein the frame boundary is attached immediate to the periphery of the substrate with its elevated surface between 40 to 100 microns above the planar surface of the substrate.

6. A spin coating apparatus for minimizing edge buildup of a coating material comprising:

framing means for attachment immediate to the periphery of a substrate to be coated, said framing means having a surface elevated above the planar surface of the substrate;

means for rotating the framed substrate in a horizontal upright position about its approximate center; and means for depositing the coating material onto the substrate, said elevated surface of said framing means forming an auxiliary surface extension to the substrate for the coating material while rotated by said rotating means to minimize the edge buildup of the coating material at the edges of the substrate.

7. A spin coating apparatus as defined in claim 6 wherein the framing means is in the shape of a square for attachment to a square substrate.

8. In an upright, horizontally operated spin coating apparatus, the improvement comprising a framing means for attachment immediate to the periphery of a substrate to be coated, said framing means having a surface elevated above the planar surface of the substrate, said elevated surface of said framing means forming an auxiliary surface extension to the substrate for the coating material to minimize the edge buildup of the coating material at the edges of the substrate during the operation of the spin coating apparatus.

* * * * *